United States Patent
You et al.

(10) Patent No.: US 7,484,156 B2
(45) Date of Patent: Jan. 27, 2009

(54) APPARATUS AND METHOD FOR TESTING PS/2 INTERFACE

(75) Inventors: Yong-Xing You, Shenzhen (CN); Feng-Long He, Shenzhen (CN); Yan-Feng Luo, Shenzhen (CN); Qian-Sheng Liu, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 387 days.

(21) Appl. No.: 11/474,755

(22) Filed: Jun. 26, 2006

(65) Prior Publication Data
US 2006/0294444 A1  Dec. 28, 2006

(30) Foreign Application Priority Data
Jun. 25, 2005  (CN) .......................... 2005 1 0035594

(51) Int. Cl.
*G06F 11/00* (2006.01)
(52) U.S. Cl. .................... 714/741; 714/742; 714/25; 714/28; 714/44; 714/724; 714/735; 714/736; 714/738; 702/118; 702/117; 702/120; 703/3; 703/4; 703/13; 703/14; 703/15; 703/25
(58) Field of Classification Search .................. None
See application file for complete search history.

(56) References Cited

U.S. PATENT DOCUMENTS

| | | | | |
|---|---|---|---|---|
| 4,692,691 A | * | 9/1987 | Sueta | 714/736 |
| 5,214,785 A | * | 5/1993 | Fairweather | 710/67 |
| 6,496,891 B1 | * | 12/2002 | Cluff et al. | 710/260 |
| 6,807,504 B2 | * | 10/2004 | Chen et al. | 702/118 |
| 6,874,038 B2 | | 3/2005 | Williams et al. | |

FOREIGN PATENT DOCUMENTS

| | | | |
|---|---|---|---|
| CN | 1232200 A | * | 10/1999 |
| CN | 1501265 A | | 6/2004 |

OTHER PUBLICATIONS

Windows Platform Design News, "Keyboard Scan Code Specification", Microsoft Corp., Revision 1.3a, Mar. 2000, at http://download.microsoft.com/download/1/6/1/161ba512-40e2-4cc9-843a-923143f3456c/scancode.doc.*

* cited by examiner

*Primary Examiner*—John P Trimmings
(74) *Attorney, Agent, or Firm*—Morris Manning Martin LLP; Tim Tingkang Xia, Esq.

(57) ABSTRACT

An apparatus for automatic testing of a PS/2 interface includes a micro controller unit, a PS/2 port, and a plurality of LEDs. The micro controller unit is coupled with both a data pin and a clock pin of the PS/2 interface. The LEDs coupled to the micro controller unit simulate functions of a keyboard. A related method for testing the PS/2 interface is also provided.

13 Claims, 4 Drawing Sheets

APPARATUS AND METHOD FOR TESTING PS/2 INTERFACE

BACKGROUND OF THE INVENTION

1. Field of the Invention

The present invention relates to an apparatus and method for testing a personal system/2 (PS/2) interface in computer interface testing.

2. General Background

PS/2 interface is a type of port developed by IBM for connecting a mouse or keyboard to a personal computer (PC). The PS/2 port supports a mini din plug containing just 6 pins. Most PCs have a PS/2 port so that the serial port can be used by another device, such as a modem.

The PS/2 interface uses a bidirectional serial protocol to transmit movement and button-position data to a computer's auxiliary device controller (keyboard controller). The computer, in turn, may send a number of commands to the mouse to set the report rate, resolution, reset the mouse, disable the mouse, etc. The computer also provides the mouse with an overload-protected 5V power supply.

The 6 pins mini-din (PS/2 style) at the computer are defined as follows:

| Pin | Name | Description |
| --- | --- | --- |
| 1 | DATA | Key Data |
| 2 | n/c | Not connected |
| 3 | GND | Ground |
| 4 | VCC | Power, +5 VDC |
| 5 | CLK | Clock |
| 6 | n/c | Not connected |

When testing the functions of the PS/2 interface of a computer, the data and clock pins of the PS/2 interface are tested.

Data transmissions to and from the auxiliary device connector consist of an 11-bit data stream sent serially over the 'data' line. The following table shows the function of each bit. The parity bit is either 1 or 0, and the 8 data bits (Data bit 0 to Data bit 7 as shown in the table), plus the parity bit, always have an odd number of 1's.

| BIT | FUNCTION |
| --- | --- |
| 11 | Stop bit (always 1) |
| 10 | Parity Bit (odd partly) |
| 9 | Data Bit 7 (most-significant) |
| 8 | Data Bit 6 |
| 7 | Data Bit 5 |
| 6 | Data Bit 4 |
| 5 | Data Bit 3 (most-significant) |
| 4 | Data Bit 2 |
| 3 | Data Bit 1 |
| 2 | Data Bit 0 (least-significant) |
| 1 | Start Bit (always 0) |

The PS/2 mouse and keyboard implement a bidirectional synchronous serial protocol. The bus is "idle" when both lines are high. This is the only state where the keyboard/mouse is allowed begin transmitting data. The host has ultimate control over the bus and may inhibit communication at any time by pulling or keeping the clock pin to transmit at a low voltage level. The device always generates the clock signal. If the host wants to send data, it must first inhibit communication from the device by pulling clock low. The host then pulls data low and releases clock. This is the "Request-to-Send" state and signals the device to start generating clock pulses.

Typically, the PS/2 interface is installed in a host and a keyboard and/or mouse are manually operated to test functions of the interface. However, the above-mentioned testing method requires a lot of space for the keyboard and mouse and is labor intensive.

What is needed therefore, is an apparatus that can automatically test the PS/2 interface.

SUMMARY

An apparatus for automatic testing of a PS/2 interface includes a micro controller unit, a PS/2 port, and a plurality of LEDs. The micro controller unit is coupled with both a data pin and a clock pin of the PS/2 interface. The LEDs coupled to the micro controller unit simulate functions of a keyboard. A related method for testing the PS/2 interface is also provided.

Other advantages and novel features will become more apparent from the following detailed description when taken in conjunction with the accompanying drawings, in which:

DETAILED DESCRIPTION OF THE EMBODIMENT

Figure 1:
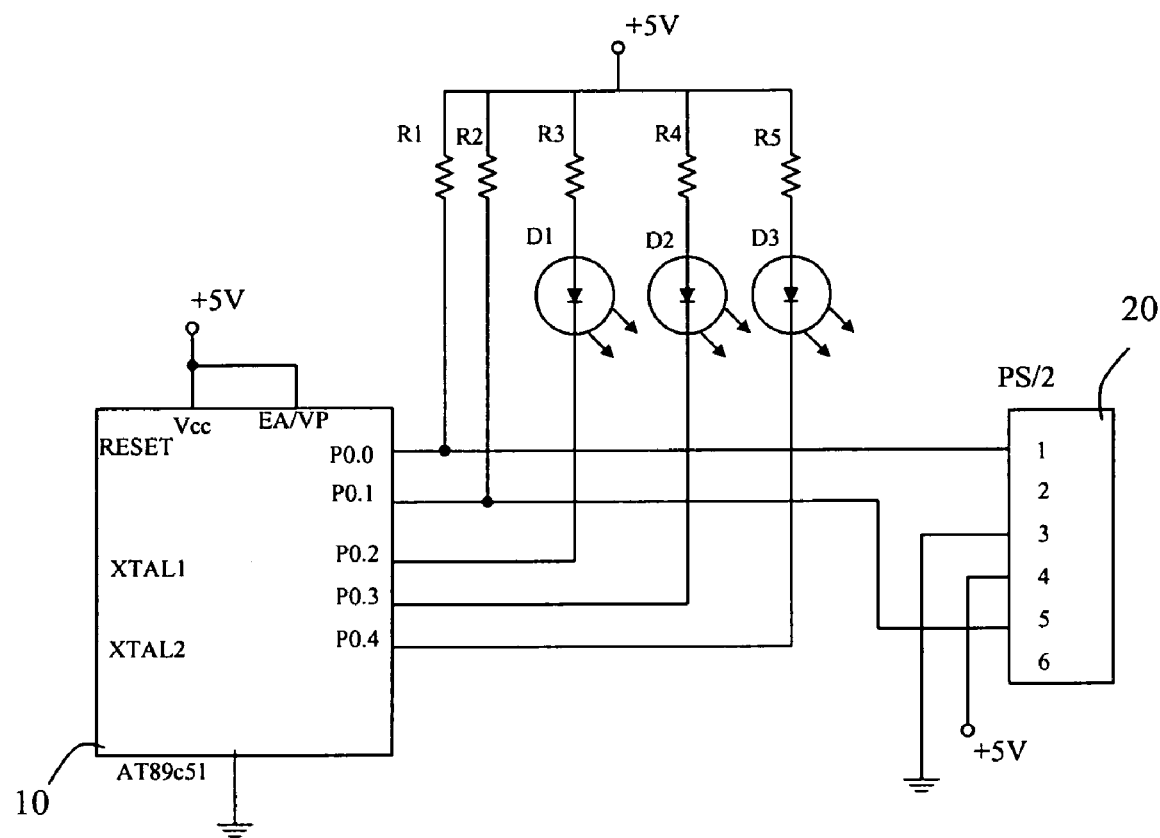
FIG. 1 is a circuit diagram of an apparatus for testing a PS/2 interface in accordance with a preferred embodiment of the present invention.

An apparatus for testing a personal system/2 (PS/2) interface in accordance with a preferred embodiment of the present invention is described herein. Referring to FIG. 1, the apparatus includes a micro controller unit 10, a PS/2 port 20, a plurality of indicators including a first light-emitting diode (LED) D1, a second LED D2, and a third LED D3, and a plurality of resistors R1-R5.

In this embodiment the type of the micro controller unit 10 is AT89c51. I/O pins P0.0 and P0.1 of the micro controller unit 10 are coupled to a data pin 1 and a clock pin 5 of the PS/2 port respectively. The pins P0.0, P0.1 are both connected to a power source as well via resistors R1, R2 respectively. In this embodiment, the power source provides +5V. Anodes of the LEDs D1, D2, and D3 are connected to the power source via divider resistors R3, R4, and R5 respectively. Cathodes of the LEDs D1, D2, and D3 are respectively coupled to I/O pins P0.2, P.0.3, and P0.4 of the micro controller unit 10. The clock pins XTAL1, XTAL2 of the micro controller unit 10 are coupled to a clock circuit, and a reset pin of the micro controller unit 10 is connected to the power source. Both a VCC pin and an EA/VP pin of the micro controller unit 10 are connected to the power source. A VCC pin 4 of the PS/2 port 20 is connected to the power source, and a GND pin 3 of the PS/2 port 20 is grounded. A host pre-programmed with user defined commands for communicating with the micro controller 10 and having the PS/2 interface to be tested installed therein is communicated with the micro controller unit 10 via the PS/2 port 20. The LEDs D1, D2, and D3 respectively simulate indicator lights of common keyboards.

A related method for testing a PS/2 interface in a host is accomplished by predetermined programs in the micro controller unit 10 for simulating manual operation of a keyboard. The apparatus is connected to the PS/2 interface 20. Upon sensing the connection, the host sends a start signal to the apparatus, which then sends a response signal. If the signals are exchanged successfully, the host then sends the user-defined commands to the apparatus for commencing testing. The apparatus then sends a full scan code set II which is translated to a scan code set I by a keyboard controller of the host. The host then compares the translated scan code set I with a reference scan code set I therein. If there is a match then the PS/2 interface passes testing and the LEDs D1, D2, and D3 light up in response to one of the user-defined commands sent by the host.

Figure 2:
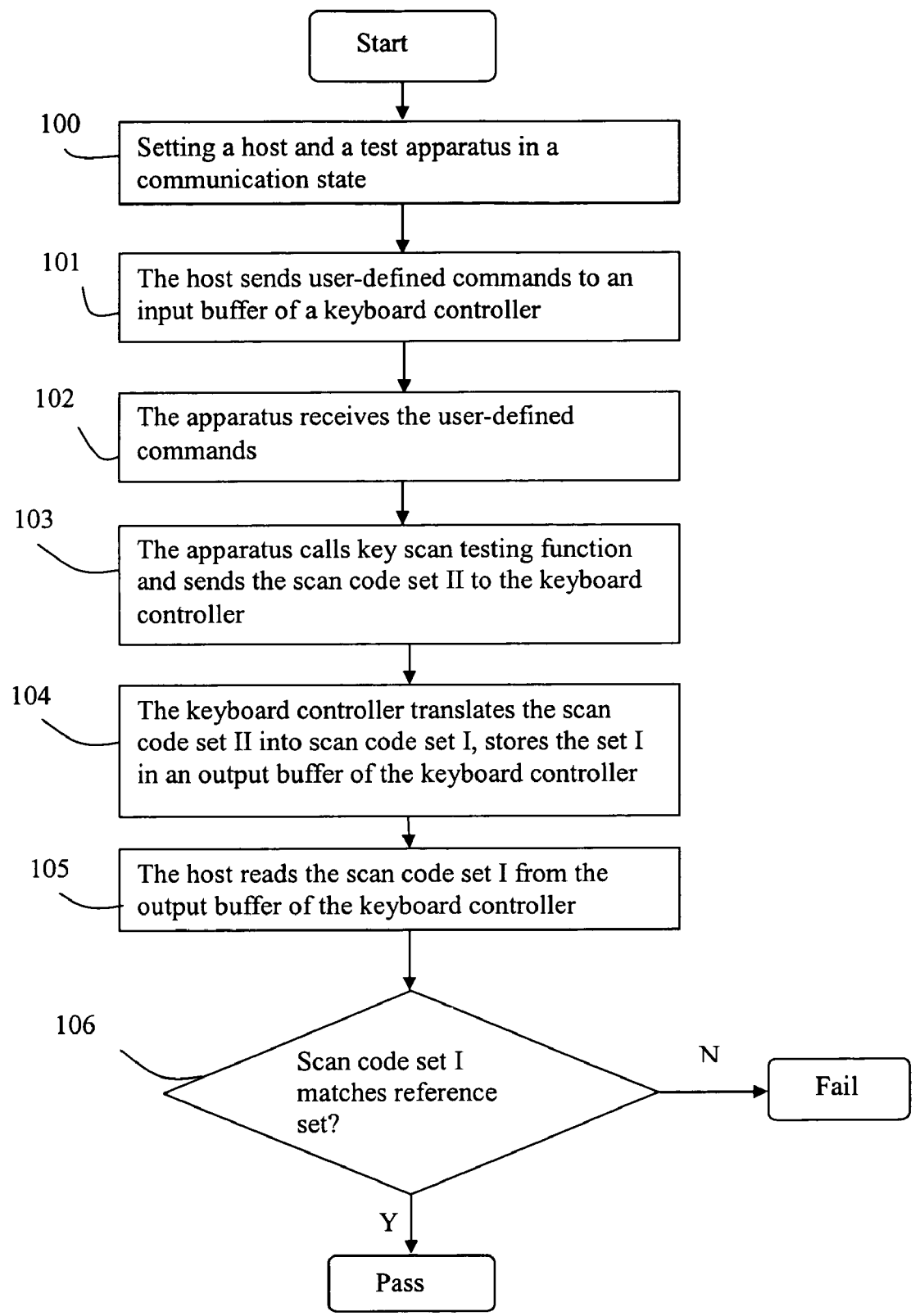
FIG. 2 is a test flow diagram of a method for testing a PS/2 interface using the apparatus of FIG. 1.

Referring to FIG. 2, detailed steps of the above method are shown.

Step 100, an operator attaches the apparatus to the PS/2 port of the host and turns the apparatus and the host on. The host then tests the function of the communications according to a flow chart of FIG. 3 that will be further explained hereinafter.

Step 101, when the communication states are normal, the host sends user-defined commands to begin testing to an input buffer of a keyboard controller that is on the motherboard of the host.

Step 102, the apparatus receives the user-defined commands from the input buffer of the keyboard controller.

Step 103, the apparatus calls a key scan testing function and sends all of the scan code set II to the keyboard controller byte by byte according to a flow chart of FIG. 4 that will be further explained hereinafter.

Step 104, the keyboard controller reads the scan code set II, translates the scan code set II into scan code set I, and stores the scan code set I in an output buffer of the keyboard controller.

Step 105, the host reads the scan code set I from the output buffer of the keyboard controller.

Step 106, the host compares the scan code set I matches the reference scan code set I. If there is a match, the result is displayed on a monitor of the host and the LEDs D1, D2, and D3 light up in response to user-defined commands sent by the host to the micro controller 20. If no match, then that result is displayed on the monitor and the LEDs D1, D2, and D3 do not light up. Note that the manner and timing of activation of the LEDs may be varied, according to the users requirement, with the user-defined commands. In other embodiments, the LEDs may be of a different number or omitted altogether or some other suitable indicator may be substituted.

Figure 3:
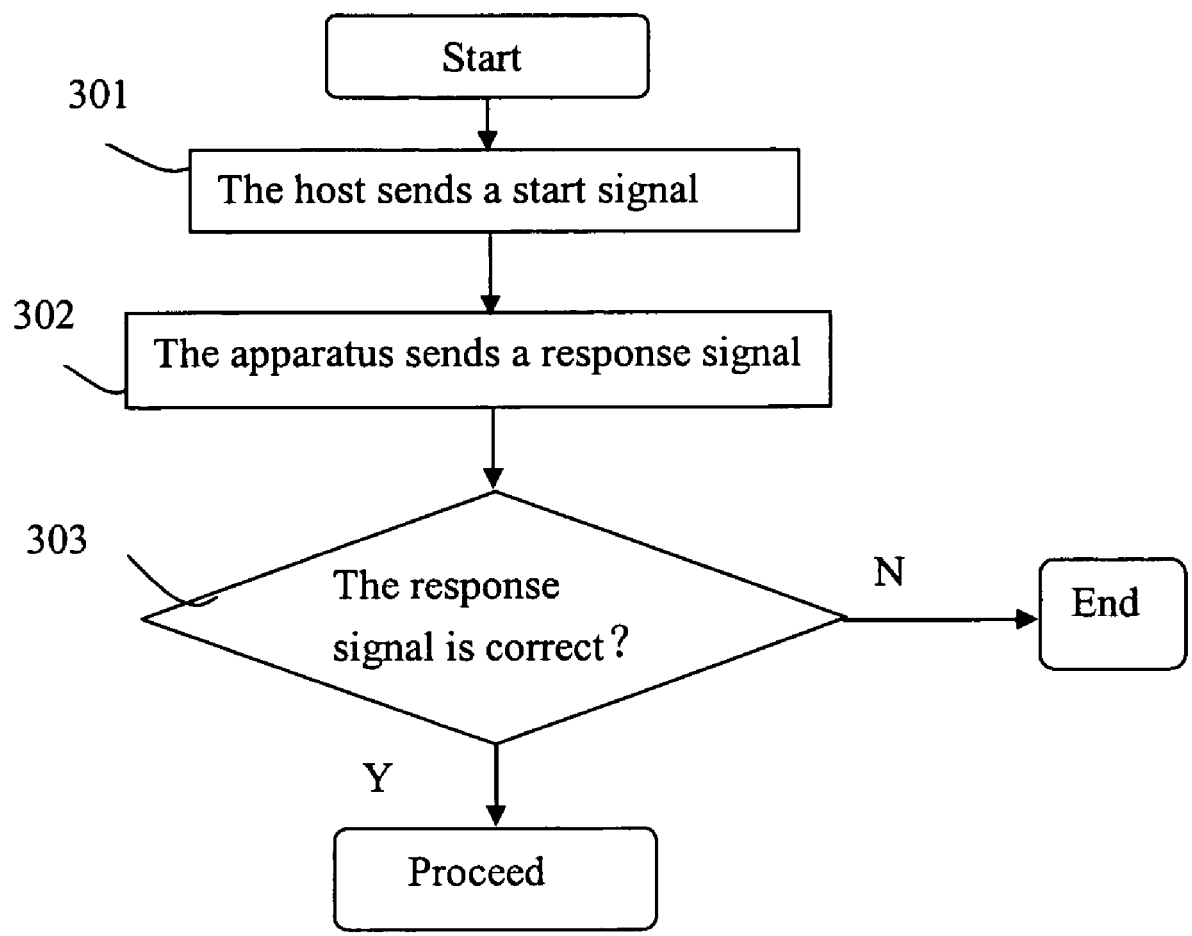
FIG. 3 is a flow chart for testing communication functions between a host and the apparatus of FIG. 1.

Referring the FIG. 3, detailed explanation of step 100 of FIG. 2 is shown, establishment of communication between the host and the apparatus of FIG. 1 is done according to the following steps.

Step 301, the host sends a start signal to the apparatus.

Step 302, the apparatus sends a response signal to the host.

Step 303, the host confirms if the response signal is correct; if yes, testing proceeds. If no, the process ends until the user initiates step 100 again.

Figure 4:
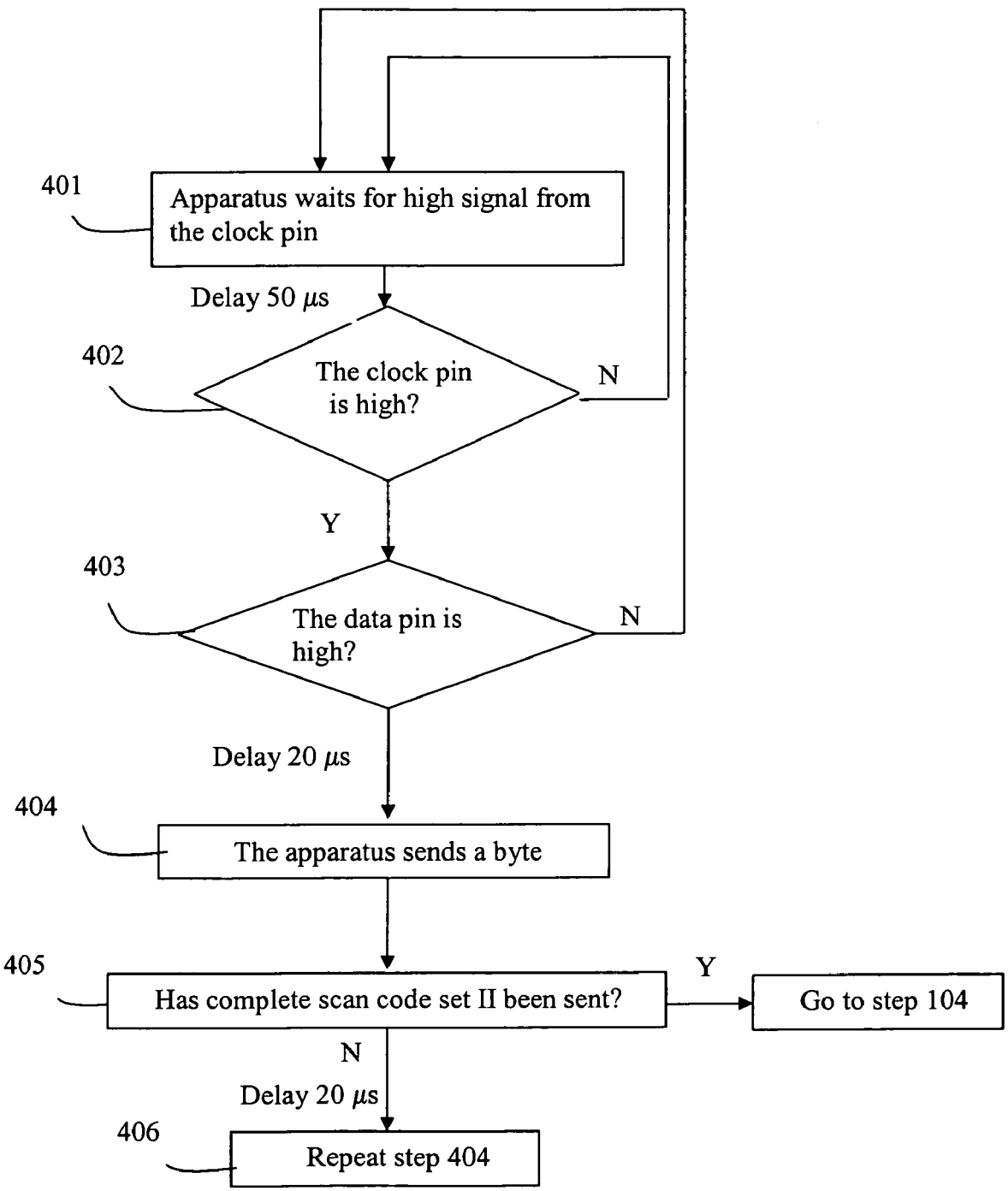
FIG. 4 is a flow chart of a process of sending bytes from the apparatus of FIG. 1 to the computer.

Referring to the FIG. 4, step 103 of FIG. 2 is detailed, the process of sending the scan code set II from the apparatus of FIG. 1 to the host byte by byte includes the following steps.

Step 401, the apparatus waits for a high signal from a clock pin.

Step 402, the apparatus checks if the clock pin is high after delaying 50 μs, if no, output from the apparatus is not allowed, return to step 401. If yes, proceed to step 403.

Step 403, the apparatus checks if the data pin is high; if no, return to step 401. If yes, proceed to step 404.

Step 404, if the data pin remains high for 20 μs the apparatus sends a byte, the byte includes a start bit, 8 data bits, a parity bit, and a stop bit.

Step 405, has complete scan code set II been sent? If yes, go to step 104. If no, go to step 406.

Step 406, the apparatus delays another 20 μs then repeats step 404.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment.

We claim:

1. An apparatus for testing a PS/2 interface of a host, comprising:
    a micro controller unit with predetermined programs for simulating manual operations of a keyboard;
    a PS/2 port connected to the micro controller unit for communicating the apparatus with the host; and
    a plurality of light-emitting diodes (LEDs) connected to the micro controller unit for simulating indicator lights of the keyboard.

2. The apparatus as claimed in claim 1, wherein data and clock pins of the PS/2 port are respectively connected to different I/O pins of the micro controller unit.

3. The apparatus as claimed in claim 1, wherein anodes of the LEDs are connected to a power source.

4. The apparatus as claimed in claim 3, wherein cathodes of the LEDs are respectively coupled to different I/O pins of the micro controller unit.

5. A method for testing a PS/2 interface of a host, comprising the steps of:
    setting both an PS/2 interface testing apparatus and the host in a communicating state;
    the host sending user-defined commands for commencing testing to an input buffer of a keyboard controller;
    the apparatus receiving the user-defined commands from the input buffer of the keyboard controller;
    the apparatus calling a key scan testing function and sending all of scan code set II to the keyboard controller byte by byte;
    the keyboard controller translating the scan code set II into scan code set I and storing the scan code set I in an output buffer of the keyboard controller;
    the host reading the data from the output buffer of the keyboard controller; and
    the host comparing the scan code set I with a reference scan code set I stored in the host and indicating a result of the comparison.

6. The method as claimed in claim 5, wherein the setting step, further comprising the steps of:
    the host sending a start signal to the apparatus;
    the apparatus sending a response signal to the host; and
    the host confirming the response signal and sending the user-defined commands for commencing testing to the apparatus.

7. The method as claimed in claim 5, wherein the calling step of the apparatus, further comprising the steps of:
    the apparatus waiting for a high signal from the clock pin;

the apparatus checking whether the clock pin being high after delaying 50 µs;

the apparatus checking whether the data pin being high under the situation that the clock pin having been high;

the apparatus sending a scan code set II one byte at a time to the keyboard controller of the host, and a delay of 20 µs between each byte, and checking the data pin still high during the delay.

8. The method as claimed in claim 7, wherein output from the apparatus is not allowed if the clock pin is low.

9. The method as claimed in claim 7, wherein the apparatus returns to waiting for the high signal from the clock pin if the data pin is low.

10. The method as claimed in claim 7, wherein the byte includes a start bit, 8 data bits, a parity bit, and a stop bit.

11. A method for testing a personal system/2 (PS/2) interface of a host to be tested, comprising the steps of:

preparing a testing apparatus comprising a programmable micro controller unit and a PS/2 port electrically connectable with a PS/2 interface of a host to be tested;

programming said micro controller unit to be responsive to said host;

setting said apparatus and said host in a data-communicable state through said connected PS/2 port of said apparatus and said PS/2 interface of said host;

setting said host to allow said apparatus responsively commencing for testing;

sending a predefined test set from said apparatus to said host through said PS/2 interface of said host; and comparing a retrieved set of said host corresponding to said test set with a reference set predefined in said host to acquire a test result for said PS/2 interface of said host.

12. The method as claimed in claim 11, further comprising the step of translating said test set to another test set formatted differently from said test set and formatted same as said reference set after said host retrieves said test set from said apparatus.

13. The method as claimed in claim 11, wherein said apparatus further comprises a plurality of indicators to simulate indicator lights of common keyboards electrically connectable and data-communicable with said PS/2 interface of said host.

* * * * *